(12) United States Patent
Iwai et al.

(10) Patent No.: US 10,940,534 B2
(45) Date of Patent: Mar. 9, 2021

(54) METAL PASTE HAVING EXCELLENT LOW-TEMPERATURE SINTERABILITY AND METHOD FOR PRODUCING THE METAL PASTE

(71) Applicant: TANAKA KIKINZOKU KOGYO K.K., Tokyo (JP)

(72) Inventors: Teruhisa Iwai, Tsukuba (JP); Yuichi Makita, Tsukuba (JP); Hidekazu Matsuda, Tsukuba (JP); Hitoshi Kubo, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 336 days.

(21) Appl. No.: 15/741,980

(22) PCT Filed: Aug. 23, 2016

(86) PCT No.: PCT/JP2016/074463
§ 371 (c)(1),
(2) Date: Jan. 4, 2018

(87) PCT Pub. No.: WO2017/033911
PCT Pub. Date: Mar. 2, 2017

(65) Prior Publication Data
US 2018/0193913 A1 Jul. 12, 2018

(30) Foreign Application Priority Data
Aug. 25, 2015 (JP) .............................. JP2015-165342

(51) Int. Cl.
*B22F 1/00* (2006.01)
*B22F 9/30* (2006.01)
(Continued)

(52) U.S. Cl.
CPC .......... *B22F 1/0062* (2013.01); *B22F 1/0018* (2013.01); *B22F 1/0022* (2013.01);
(Continued)

(58) Field of Classification Search
None
See application file for complete search history.

(56) References Cited

U.S. PATENT DOCUMENTS

2014/0318618 A1* 10/2014 Paik ...................... B22F 1/0018
136/256

FOREIGN PATENT DOCUMENTS

| JP | 11-66957 A | 3/1999 |
|---|---|---|
| JP | 2000-76931 A | 3/2000 |

(Continued)

OTHER PUBLICATIONS

PCT, International Search Report for PCT/JP2016/074463, dated Nov. 16, 2016.

*Primary Examiner* — Colin W. Slifka
(74) *Attorney, Agent, or Firm* — Orrick, Herrington & Sutcliffe LLP; Joseph A. Calvaruso; K. Patrick Herman

(57) ABSTRACT

A metal paste formed by kneading a solid content including silver particles and a solvent, in which the solid content includes silver particles containing silver particles having a particle size of 100 to 200 nm by 30% or more based on the number of particles, the silver particles have an average particle size of 60 to 800 nm as a whole, the silver particles constituting the solid content are bound with an amine compound having 4 to 8 carbon atoms in total as a protective agent, and the metal paste contains as an additive a high-molecular-weight ethyl cellulose having a number average molecular weight of 40000 to 90000. Since the metal paste contains a high-molecular-weight ethyl cellulose, a sintered body having a low resistance can be maintained while (Continued)

printability is improved. The metal paste has favorable printability, and can form a sintered body having a low resistance even in a low temperature region of 150° C. or lower.

13 Claims, 5 Drawing Sheets

(51) Int. Cl.

| | |
|---|---|
| *H01B 1/22* | (2006.01) |
| *C08J 7/06* | (2006.01) |
| *H05K 1/09* | (2006.01) |
| *H05K 3/12* | (2006.01) |
| *B23K 35/02* | (2006.01) |
| *B23K 35/30* | (2006.01) |
| *C08J 3/20* | (2006.01) |
| *C08K 3/08* | (2006.01) |
| *C08K 5/17* | (2006.01) |
| *H01C 17/065* | (2006.01) |
| *C08K 9/04* | (2006.01) |
| *B22F 5/00* | (2006.01) |
| *H01C 7/00* | (2006.01) |

(52) U.S. Cl.
CPC .............. *B22F 9/30* (2013.01); *B23K 35/025* (2013.01); *B23K 35/3006* (2013.01); *C08J 3/20* (2013.01); *C08J 7/06* (2013.01); *C08K 3/08* (2013.01); *C08K 5/17* (2013.01); *H01B 1/22* (2013.01); *H01C 17/06526* (2013.01); *H01C 17/06586* (2013.01); *H05K 1/092* (2013.01); *H05K 3/1283* (2013.01); *B22F 5/00* (2013.01); *B22F 2301/255* (2013.01); *C08J 2301/28* (2013.01); *C08J 2367/02* (2013.01); *C08K 9/04* (2013.01); *C08K 2003/0806* (2013.01); *C08K 2201/005* (2013.01); *H01C 7/003* (2013.01)

(56) References Cited

FOREIGN PATENT DOCUMENTS

| | | | |
|---|---|---|---|
| JP | 200076931 | * | 3/2000 |
| JP | 2009-170447 | A | 7/2009 |
| JP | 2010-265543 | A | 11/2010 |
| JP | 2013-36057 | A | 2/2013 |
| WO | WO 2011/155615 | A1 | 12/2011 |

* cited by examiner

METAL PASTE HAVING EXCELLENT LOW-TEMPERATURE SINTERABILITY AND METHOD FOR PRODUCING THE METAL PASTE

TECHNICAL FIELD

The present invention relates to a metal paste having silver particles dispersed in a solvent. Specifically, the present invention relates to a metal paste which essentially contains silver particles having a particle size of 100 to 200 nm, has favorable printability, and can be sintered even at relatively low temperature of 150° C. or lower. The present invention also provides a metal paste which has the above-mentioned properties, and is capable of producing a silver sintered body having a low resistance.

BACKGROUND ART

A metal paste having conductive metal particles as a solid content kneaded and dispersed in a solvent is used as a circuit-forming material in the printed electronics and a conductive bonding material for bonding various kinds of semiconductor elements to the substrate. This metal paste forms a circuit and an electrode or a bonding portion or adhesive portion after being coated on a substrate or a member to be bonded and then heated and calcined to sinter the metal particles.

As a metal paste which is particularly useful for the above applications, one which applies silver particles as metal particles attracts attention. Silver is a metal having a low specific resistance, and a sintered body of silver that is properly formed can effectively act as a conductive film. Additionally, silver has an advantage of being excellent in thermal conductivity, and a metal paste to which silver is applied regarded to be effective as a bonding material and a thermally-conductive material for manufacturing a semiconductor device, such as a power device, to which a high current is applied so as to have a high operating temperature.

As a metal paste to which silver particles are applied, for example, a bonding material is described in Patent Document 1 which contains silver nanoparticles having an average primary particle size of 1 to 200 nm and a dispersing medium having a boiling point of 230° C. or higher and further containing submicron silver particles in 0.5 to 3.0 µm. A bonding material formed of the metal paste described in Patent Document 1 has a bonding temperature (calcining temperature) for sintering of the silver particles of 200° C. or higher. This bonding temperature can be considered as a low temperature compared to the bonding temperature by a brazing material, but it is difficult to consider that the temperature is low enough. To be low and high of the bonding temperature is a factor that can affect the semiconductor element of a material to be bonded, and thus a metal paste that can be sintered at temperature as low as possible is desirable.

Here, there has been known an adjustability that the sintering temperature of the metal particles by the control of the size (particle size) of the metal particles. This is referred to as a so-called nano-size effect and is a phenomenon that the melting point of metal particles significantly drops when the metal particles become fine particles in nano-level of several tens nm or less as compared to that of a bulk material. It is considered that sintering of the metal paste described in Patent Document 1 at low temperature is difficult since it contains silver particles having a relatively great particle size of a submicron size, but it is considered that a metal paste which can be sintered at a lower temperature can be obtained by the use of this nano-size effect.

As the silver particles in nano-level, those manufactured by the thermal decomposition method of a silver complex by Patent Document 2 and the like have been reported. The thermal decomposition method obtains silver particles in such a manner that a thermally decomposable silver compound such as silver oxalate ($Ag_2C_2O_4$) as a starting material is reacted with an appropriate organic material to form a complex to be the precursor and this is heated. According to the thermal decomposition method, silver particles having a relatively uniform particle size and an average particle size in minute nano-level of several nm to several tens of nm can be manufactured.

RELATED ART DOCUMENT

Patent Documents

Patent Document 1: WO 2011/155615 A1
Patent Document 2: JP 2010-265543 A

SUMMARY OF THE INVENTION

Problem to be Solved by the Invention

The above-mentioned metal paste is required to have such favorable printability that a metal paste can be transferred to a substrate in accordance with a designed pattern in application of various kinds of printing techniques in order to form a fine circuit pattern, electrode or the like. For example, in screen printing, the metal paste is required to have such high printability that the metal paste can be transferred in accordance with a design without deposition of the metal paste on a squeegee and occurrence of deformation, defects or the like in a transfer shape. However, when the silver particles in nano-level are applied to a substrate by screen printing, it may be unable to obtain a favorable transfer shape.

In addition, although the silver particles in nano-level are sintered at low temperature of 200° C. or lower, the resistance value of the sintered body of the silver particles is remarkably higher than that of the bulk material. This problem greatly impairs the usefulness of a metal paste as a circuit material or a conductive bonding material.

Accordingly, the present invention provides a metal paste containing silver particles, the metal paste having favorable printability, and being capable of sintering silver particles in a low temperature region, and also capable of forming a sintered body having a low resistance or a sintered body excellent in thermal conductivity. The target value of the sintering temperature is set to a low temperature region of 150° C. or lower.

Means for Solving the Problem

The present invention for solving the problems provides a metal paste formed by kneading a solid content including silver particles and a solvent, in which the solid content includes silver particles containing silver particles having a particle size of 100 to 200 nm by 30% or more based on the number of particles, the silver particles have an average particle size of 60 to 800 nm as a whole, the silver particles constituting the solid content are bound with an amine compound having 4 to 8 carbon atoms in total as a protective agent, and the metal paste contains as an additive a highmolecular-weight ethyl cellulose having a number average molecular weight of 40000 to 90000.

The metal paste according to the present invention contains as an additive a high-molecular-weight ethyl cellulose having a predetermined number average molecular weight, and contains silver particles having a particle size in a moderate range of 100 to 200 nm at a certain proportion or more as silver particles constituting the solid content kneaded with a solvent, with the silver particles having an average particle size within a predetermined range as a whole. Further, a protective agent containing a specific amine compound is bound to the silver particles. According to the present inventors, the possibility of the silver particles to be sintered at low temperature and a decrease in resistance of the sintered body, which are the object of the present application, are effectively achieved as a result of the combination of setting the particle size range of main silver particles into the above range and selecting a proper protective agent. Since the metal paste contains a high-molecular-weight ethyl cellulose as an additive, a sintered body having a low resistance can be maintained while printability is improved. Hereinafter, the present invention will be described in more detail.

The metal paste in the present invention contains a high-molecular-weight ethyl cellulose as an additive. In the present invention, the high-molecular-weight ethyl cellulose is an ethyl cellulose having a number average molecular weight of 40000 to 90000, preferably an ethyl cellulose having a number average molecular weight of 55000 to 85000. By applying such a high-molecular-weight ethyl cellulose, the metal paste can be transferred in accordance with a design to perform printing without deposition of the paste on a squeegee and occurrence of defective transfer when a circuit pattern or the like is formed by use of the metal paste. The reason why printability is improved as described above is that moderate thixotropic property is imparted to the metal paste by addition of the ethyl cellulose.

The type of ethyl cellulose as an additive is limited to one having a high molecular weight as a result of consideration of a resistance value of a sintered body obtained by sintering the metal paste after printing. As described above, one of objects of the present invention is to provide a metal paste capable of forming a sintered body having a low resistance value with consideration given to usefulness as a circuit material or a conductive bonding material. In this respect, studies by the present inventors have revealed that when the number average molecular weight of the ethyl cellulose is excessively small, the resistance value after sintering may increase. From such a point of view, the high-molecular-weight ethyl cellulose is employed as an additive not only for improving printability but also with consideration given to the resistance value of a sintered body. The specific resistance value is preferably 10 μΩ·cm or less in terms of a volume resistance value for a resistor formed by applying the metal paste of the present invention onto a substrate, and then firing the metal paste. When the number average molecular weight of the high-molecular-weight ethyl cellulose is excessively high, it is difficult to obtain an effect of improving printability.

Preferably, the metal paste in the present invention additionally contains a low-molecular-weight ethyl cellulose in addition to a high-molecular-weight ethyl cellulose. In the present invention, the low-molecular ethyl cellulose is an ethyl cellulose having a number average molecular weight of 5000 to 30000, preferably an ethyl cellulose having a number average molecular weight of 10000 to 25000. When such a low-molecular-weight ethyl cellulose is added, the thixotropic property of the metal paste is improved, so that printability can be further improved. When the number average molecular weight of the low-molecular-weight ethyl cellulose is excessively low, it is difficult to obtain an effect of improving printability, and when the number average molecular weight of the low-molecular-weight ethyl cellulose is excessively high, the resistance value of a sintered body easily increases.

Here, the metal paste additionally contains a low-molecular-weight ethyl cellulose, the content of the low-molecular-weight ethyl cellulose is preferably equal to or less than a predetermined content with consideration given to the resistance value of the sintered body. Specifically, the ratio ($C_{LOW}/C_{HIGH}$) of the content ($C_{LOW}$) of the low-molecular-weight ethyl cellulose to the content ($C_{HIGH}$) of the high-molecular-weight ethyl cellulose is preferably 0.05 to 1.0, especially preferably 0.1 to 0.4.

The total content of the ethyl cellulose (sum of the content of the high-molecular-weight ethyl cellulose and the low-molecular-weight ethyl cellulose) is preferably 1.2 wt % to 3.5 wt % in terms of a mass ratio to the whole paste. When total content of the ethyl cellulose is less than 1.2 wt %, it is difficult to obtain the effect of improving printability, and When total content of the ethyl cellulose is more than 3.5 wt %, it is difficult to decrease the resistance value of a sintered body.

As the ethyl cellulose, one having any ethoxy content can be applied for both the high-molecular-weight ethyl cellulose and the low-molecular-weight ethyl cellulose. The ethoxy content is preferably 46.0% to 52.0%, especially preferably 48.0% to 49.5%.

The silver particles as a main component of the metal paste of the present invention will now be described. The metal paste according to the present invention requires that the silver particles having a particle size of 100 to 200 nm be present at 30% or more with respect to the entire silver particles to be the solid content based on the number of particles. This is because the moderately fine silver particles contribute to the low temperature sintering. Preferably, the entire silver particles contained in the paste have a particle size of 100 to 200 nm, that is, the proportion of the silver particles is 100%, but it is not required to be the case. Particles having a particle size out of this range may be present as long as the silver particles having a particle size of 100 to 200 nm are 30% or more. For example, even a metal paste in which silver particles having a particle size of 100 to 200 nm and silver particles having a particle size of 20 to 30 nm are present together can be sintered at 150° C. or lower as long as the proportion of the silver particles having a particle size of 100 to 200 nm is 30% or more, and the resistance value of the sintered body is low. Additionally, in the metal paste, silver particles having a particle size of 100 to 200 nm and coarse silver particles having a particle size of more than 500 nm are present together. Usually, coarse silver particles greater than 500 nm (0.5 μm) are not sintered at 200° C. or lower. However, the entire silver particles including such coarse particles are sintered at low temperature when the silver particles having a particle size of 100 to 200 nm to be applied in the present invention are present at a certain proportion or more.

The metal paste is not sintered at all or is insufficiently sintered at 150° C. or lower when the proportion of the number of particles of the silver particles having a particle size of 100 to 200 nm is less than 30%. The metal paste in which the entire silver particles have a particle size of 100 to 200 nm, that is, the number proportion of these silver particles is 100% also has the effect of the present invention as a matter of course. Thus, in the present invention, there is a case in which a group of silver particles having different particle sizes are present together while those having a particle size of 100 to 200 nm are present as the main silver particles, but the average particle size (number average) of the entire silver particles is 60 to 800 nm. When the average particle size is less than 60 nm, the resistance value may increase due to deterioration of adhesion because cracks easily generate at the time when the particles form a sintered body. When the average particle size is more than 800 nm, sintering hardly proceeds, and cracks easily occur in the sintered body.

In the paste according to the present invention, the sinterability of the silver particles having a particle size of 100 to 200 nm is also affected by the action of the protective agent that binds to the silver particles. The protective agent is a compound that binds to a portion or the entire surface of the metal particles to be suspended in the solvent, and it suppresses the aggregation of the metal particles. In the present invention, the protective agent that binds to the silver particles is an amine compound having 4 to 8 carbon atoms in total.

As the protective agent for the silver particles, an organic substance such as a carboxylic acid other than an amine is generally applicable, but the protective agent applied in the present invention is limited to an amine compound since the silver particles are not sintered at 150° C. or lower when a protective agent other than an amine is applied. With regard to this, low temperature sintering does not occur when a protective agent other than an amine is applied even though the particle size of the silver particles is within the range of 100 to 200 nm.

Additionally, the sum of the number of carbon atoms of the amine compound that is the protective agent is set to 4 to 8 since the stability and sintering characteristics of the silver particles are affected by the number of carbon atoms in the amine in association with the particle size of the silver particles. This is because an amine having less than 4 carbon atoms hardly stabilizes the silver fine particles having a particle size of 100 nm or more and hardly forms a uniform sintered body. On the other hand, an amine having more than 8 carbon atoms tends to excessively increase the stability of the silver particles so that the sintering temperature is raised. Accordingly, the protective agent of the present invention is limited to an amine compound having 4 to 8 carbon atoms in total.

Furthermore, the amine compound preferably has a boiling point of 220° C. or lower. Regarding silver particles bound with the amine compound having a high boiling point, the amine compound hardly separates from the silver particles at the time of sintering even though the particle size range is in an appropriate range so as to inhibit the progress of sintering.

As the number of amino group in the amine compound that is the protective agent, a (mono) amine having one amino group or a diamine having two amino groups can be applied. The number of hydrocarbon groups bonded to the amino group is preferably 1 or 2. In other words, a primary amine ($RNH_2$) or a secondary amine ($R_2NH$) is preferable. At least one or more amino groups are preferably those of a primary amine or a secondary amine when a diamine is applied as the protective agent. The hydrocarbon group bound to the amino group may be a hydrocarbon group having a cyclic structure in addition to a chain hydrocarbon having a straight or a branched structure. Additionally, it may partially contain oxygen. Specific suitable examples of the protective agent that is applied in the present invention may include the following amine compounds.

TABLE 1

| Total number of carbon atoms | Preferred amine compounds |
|---|---|
| C4 | butyl amine, 1,4-diaminobutane, 3-methoxypropylamine |
| C5 | pentylamine, 2,2-dimethylpropylamine, 3-ethoxypropylamine, N,N-dimethyl-1,3-diaminopropane |
| C6 | hexylamine |
| C7 | heptylamine, benzylamine, N,N-diethyl-1,3-diaminopropane |
| C8 | octylamine, 2-ethylhexylamine |

The protective agent containing the amine compounds preferably binds to the entire silver particles in the metal paste. In the present invention, the silver particles having a particle size of 100 to 200 nm are essential, but silver particles having a particle size beyond the range are also allowed to be present together. It is a matter of course that the protective agent of the silver particles having a particle size of 100 to 200 nm is required to be the amine compound even when such silver particles having a particle size in a different range are present together, and it is required that the protective agent of the amine compound is required to bind to the silver particles having a particle size outside the range of 100 to 200 nm. However, the protective agents are not required to be exactly the same compounds, but different protective agents may be contained as long as they are amine compounds (for example, within the range shown in Table 1) having 4 to 8 carbon atoms in total.

In the metal paste according to the present invention, the amine compound as the protective agent is preferably contained in an adequate amount and preferably binds to the silver particles to secure the low-temperature sinterability. When the protective agent is scarce, the effect to protect the silver particles is not enough and thus the silver particles are aggregated with one another at the time of storage to impair the low-temperature sinterability. Additionally, when the protective agent is excessively bound to the silver particles, the volume shrinkage of the silver sintered body by the amine loss becomes greater at the time of sintering and thus it is concerned that a great number of cracks generate in the sintered body. Consequently, the balance between the nitrogen concentration and the silver concentration in the paste is important regarding the amount of protective agent (amine compound) in the paste according to the present invention. Specifically, a protective agent having the ratio (N (mass %)/Ag (mass %)) of the nitrogen concentration (mass %) to the silver particle concentration (mass %) of 0.0003 to 0.003 is preferable. The effect to protect the silver particles is insufficient when the ratio is less than 0.0003, and cracks may be generated in the sintered body when the ratio exceeds 0.003. Incidentally, the nitrogen concentration in the metal paste can be measured by elemental analysis (CHN analysis and the like) of the paste, and the silver particle concentration can be easily determined from the silver particle mass and the amount of the solvent which are used at the time of manufacturing the paste.

The above-described silver particles to which the protective agent for the silver particles described above has been bound are dispersed and suspended in a solvent, and form a metal paste. The solvent is preferably an organic solvent having 8 to 16 carbon atoms, an OH group in the structure, and a boiling point of 280° C. or lower. This is because it is difficult to volatilize and remove the solvent having a boiling point of higher than 280° C. when the intended sintering temperature of the silver particles is 150° C. or lower. Preferred specific examples of this solvent may include terpineol (C10, boiling point: 219° C.), dihydroterpineol (C10, boiling point: 220° C.), Texanol (C12, boiling point: 260° C.), 2,4-dimethyl-1,5-pentanediol (C9, boiling point: 150° C.), and 2,2,4-trimethyl-1,3-pentanediol diisobutyrate (C16, boiling point: 280° C.). Plural kinds of solvents may be used as a mixture, or a single solvent may be used.

Regarding the mixing ratio of the solvent to the solid content (silver particles) in the entire paste, the solvent content is preferably set to 5% to 60% in a mass ratio. The viscosity of the paste is too high when the solvent content is less than 5%. Additionally, it is difficult to obtain a sintered body having a required thickness when the solvent content exceeds 60%.

The metal paste according to the present invention essentially contains a high-molecular-weight ethyl cellulose as an additive, and may also contain an additive other than the ethyl cellulose if necessary. As the additive other than the ethyl cellulose, a binder composed of a polymer resin can be used. Examples of the polymer resin include polyester resins, polystyrene resins, polyethylene resins, acrylic resins, phenol resins, polycarbonate resins, urethane resins and epoxy resins. By adding such a binder to the metal paste according to the present invention, adhesion to a liquid crystal polymer can be improved. The content of the binder is preferably 0.8 to 2.5%, especially preferably 1.0 to 1.5% in terms of a mass ratio to the metal paste according to the present invention. However, the metal paste according to the present invention has favorable adhesion to a variety of base materials, and therefore addition of a binder is not essential.

Next, the method for manufacturing a metal paste according to the present invention is described. The metal paste according to the present invention is manufactured by kneading a solid content containing the silver particles that have a particle size of 100 to 200 nm at 30% or more in the solvent, and the metal paste contains as an additive a high-molecular-weight ethyl cellulose having a number average molecular weight of 40000 to 90000. It is required to manufacture the silver particles while adjusting the particle size and the particle size distribution to manufacture solid content containing silver particles which contain the silver particles having a particle size of 100 to 200 nm at 30% or more. Preferably, the reaction system in the present invention is basically includes only a silver-amine complex as a precursor, and water. The reaction system may optionally contain a uniformizing agent as described later. The reaction system may optionally contain an ethyl cellulose as an additive for the metal paste although the ethyl cellulose is not involved in the reaction.

Here, in the present invention, a thermal decomposition method using a silver complex as a precursor is employed as the method for manufacturing the silver particles. In the thermal decomposition method, silver particles are obtained in such a manner that a silver complex is formed from a thermally decomposable silver compound such as silver oxalate ($Ag_2C_2O_4$) as a starting material and an organic compound to be the protective agent and this is heated as a precursor. The thermal decomposition method is applied also in Patent Document 2, and the particle size can be more easily adjusted by the thermal decomposition method than other silver particle manufacturing methods such as the liquid-phase reduction method (method described in Patent Document 1) and the silver particles having a relatively uniform particle size can be manufactured.

However, according to the present inventors, the thermal decomposition method so far is suitable for the manufacture of fine silver particles having an average particle size of several nm to several tens of nm, but it has been difficult to preferentially manufacture the silver particles which are the target of the present invention and have a particle size in a moderate particle size range of 100 to 200 nm. The present inventors took the mechanism of the silver particle generation by the thermal decomposition method into consideration and adjusted the water content in the reaction system when a silver complex is thermally decomposed to be converted into silver particles so that silver particles having a particle size of 100 to 200 nm can be preferentially manufactured.

That is, in the method for manufacturing silver particles in the present invention, silver particles are manufactured in such a manner that a thermally decomposable silver compound is mixed with an amine to manufacture a silver-amine complex of a precursor and the reaction system containing the precursor is heated, and the water content in the reaction system before heating is set to 5 to 100 parts by mass based on 100 parts by mass of the silver compound.

In the method for manufacturing silver particles of the present invention, as the thermally decomposable silver compound to be a starting material, silver oxalate, silver nitrate, silver acetate, silver carbonate, silver oxide, silver nitrite, silver benzoate, silver cyanate, silver citrate, and silver lactate can be applied. Among these silver compounds, silver oxalate ($Ag_2C_2O_4$) or silver carbonate ($Ag_2CO_3$) is particularly preferable. Silver oxalate or silver carbonate does not require any reducing agent to decompose at relatively low temperature, and can produce silver particles. Additionally, carbon dioxide generated by the decomposition is released as a gas and thus impurities do not remain in the solution.

Incidentally, being explosive in a dry state, silver oxalate in a wet state mixed with a dispersion medium composed of water or an organic solvent (an alcohol, an alkane, an alkene, an alkyne, a ketone, an ether, an ester, a carboxylic acid, a fatty acid, an aromatic compound, an amine, an amide, a nitrile, or the like) is preferably used. Silver oxalate in a wet state is much less explosive and easier to handle. At this time, one obtained by mixing 100 parts by mass of silver oxalate with 5 to 200 parts by mass of dispersing solvent is preferable. It is preferable to use only water as the type of the dispersion medium. In addition, as described above, water is required to be mixed within a range not exceeding the regulated amount since the water content in the reaction system is strictly regulated in the present invention.

The silver-amine complex to be a precursor of the silver particles is produced by mixing and reacting of the silver compound and an amine compound. As the amine used here, the above-described amine compound having 4 to 8 carbon atoms in total is applied.

As the mixing amount of the amine compound, the amount of the amine compound is adjusted so that the ratio (mass of amine compound (protective agent)/mass of Ag) of the mass of the amine compound (protective agent) to the mass of silver in the silver compound is 2 to 5. This is because a sufficient amount of silver-amine complex is produced without causing the unreacted silver compound. Incidentally, the amine compound excessively bound to the silver particles is removed by washing after the manufacture of silver particles.

The silver-amine complex is produced by the reaction between the silver compound and the amine compound and a reaction system for the manufacture of silver particles is formed. Thereafter, the silver particles are produced by heating of this reaction system, but in the present invention, the water content in the reaction system is regulated at this stage. The water in the reaction system is believed to act as a buffer to uniformly progress the heating in the decomposition step of the complex. In the present invention, by using the buffering action of water, the nucleation or nucleus growth of silver particles is uniformly progressed and promoted while relaxing the temperature difference in the reaction system at the time of heating.

The water content in the reaction system is required to be in a range of 5 to 100 parts by mass based on 100 parts by mass of the silver compound. A preferred range of the water content is 5 to 95 parts by mass, and a more preferred range of the water content is 5 to 80 parts by mass. When the water content is small (less than 5 parts by mass), the particle size of the silver particles to be obtained is mainly a micro size of less than 100 nm, and the proportion of silver particles in 100 to 200 nm decreases. On the other hand, when the water content (more than 100 parts by mass) is great, the particle size variation of silver particles is too great and the proportion of silver particles in 100 to 200 nm tends to decrease.

Incidentally, the water content in this reaction system means a water content immediately before the heating step, and the amount of water added to the reaction system until that time needs to be considered. As described above, when silver oxalate is applied as the silver compound, there is a case in which silver oxalate is used in a wet state obtained by adding water to the silver oxalate in advance, and the amount of this previously added water is also included in the water content. Thus, the reaction system may be heated as it is without separately adjusting the water content when the water content is within the regulated range by only the amount that is added in advance to the silver compound or the uniformizing agent. On the other hand, when the amount that is added in advance is less than the lower limit (5 parts by mass) of the water content, the water content is required to be adjusted by separately adding water singly or the like. The timing to add water may be before the heating step, and water may be added at any stage such as before the formation of the silver-amine complex or after the formation of the complex.

In the present invention, the reaction system includes a silver-amine complex and water in a proper range, and also (high-molecular-weight or low-molecular-weight) ethyl celluloses are used as an additive. The ethyl cellulose may be added with any timing in manufacture of the metal paste. Preferably, the ethyl cellulose is added after a solid content composed of silver particles and a solvent are kneaded. This is because the ethyl cellulose is easily dispersed uniformly in the metal paste. The high-molecular-weight ethyl cellulose and the low-molecular-weight ethyl cellulose may be added at a time after being mixed, or may be added separately.

In manufacture of silver particles according to the present invention, an additive for adjusting a particle size distribution (increasing the ratio of silver particles having a particle size of 100 to 200 nm) and further stabilizing a silver complex can be used as an additive that can be added in addition to the ethyl cellulose. Specifically, a uniformizing agent for adjusting the particle size distribution can be used. This uniformizing agent is an organic compound that is represented by Chemical Formula 1 and has an amide as the scaffold. This uniformizing agent is an additive to align the particle size of the silver particles by uniformizing the stability of the silver-amine complex in the reaction system and aligning the timing of nucleation and nucleus growth when the silver particles are produced by decomposition of the complex.

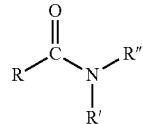

[Chem. 1]

(R represents a hydrogen atom, a hydrocarbon group, an amino group or a combination thereof, and R' and R" each represent a hydrogen atom or a hydrocarbon group)

The organic compound which functions as the uniformizing agent is required to have an amide (carboxylic acid amide) (N—C=O) as the scaffold. As the substituents (R, R', and R") of the amide, hydrogen, a hydrocarbon, an amino group, or an aminoalkyl containing a combination of these can be applied as R, and hydrogen or a hydrocarbon can be applied as R' and R". According to the present inventors, the amide of the organic compound that is the uniformizing agent acts on the amine moiety of the silver-amine complex so that the complex is stabilized. Specific examples of the organic compound that is the uniformizing agent may include N,N-dimethylformamide (DMF: $(CH_3)_2NCHO$), N,N-diethylformamide (DEF: $(C_2H_5)_2NCHO$), N,N-dimethylacetamide ($C_4H_9NO$), N,N-dimethylpropionamide ($C_5H_{11}NO$), and N,N-diethylacetamide ($C_6H_{13}NO$) in addition to urea and any urea derivative. Examples of the urea derivative may include 1,3-dimethylurea ($C_3H_8N_2O$), tetramethylurea ($C_5H_{12}N_2O$), and 1,3-diethylurea ($C_5H_{12}N_2O$).

When a uniformizing agent is added to the reaction system, the amount of the uniformizing agent is preferably 0.1 or more as a ratio ($mol_{uniformizing\ agent}/mol_{Ag}$) of the number of moles ($mol_{uniformizing\ agent}$) of the uniformizing agent to the number of moles ($mol_{Ag}$) of silver in the silver compound. When a plurality of organic compounds are simultaneously used as the uniformizing agent, the total amount of them added is preferably set to 0.1 or more. When the molar ratio is less than 0.1, the effect of the uniformizing agent is hardly exerted. On the other hand, the upper limit value of the molar ratio (upper limit amount of uniformizing agent) is not particularly regulated, but it is preferably set to 4 or less with respect to silver in the silver compound in consideration of the purity of the silver particles. The uniformizing agent is preferably added as it is when it is a liquid organic compound. Additionally, the uniformizing agent may be added as a solid content or an aqueous solution when it is a solid content compound such as urea. However, the water content in the reaction system is required to be considered when the solid content compound is prepared as an aqueous solution.

The silver particles precipitate as the water content in the reaction system is confirmed, an additive is added to the reaction system if necessary, and the reaction system is then heated. The heating temperature at this time is preferably set to a temperature that is equal to or higher than the decomposition temperature of the silver-amine complex. As described above, the decomposition temperature of the silver-amine complex varies depending on the kind of the amine which coordinates the silver compound, and the specific decomposition temperature of the silver complex of an amine compound to be applied in the present invention is 90 to 130° C.

In the heating step of the reaction system, the heating rate affects the particle size of the silver particles to precipitate, and thus the particle size of the silver particles can be controlled by adjusting the heating rate in the heating step. Here, the heating rate in the heating step is preferably adjusted within a range of 2.5 to 50° C./min to the decomposition temperature set.

Silver particles precipitate by passing through the above heating step. The precipitated silver particles are recovered through solid content-liquid separation and used as the solid content of the metal paste. The important thing here is to wash the silver particles to be recovered so that the amine compound does not excessively bind to the silver particles. As described above, preferably, the amount (nitrogen content in the paste) of the amine compound bound to the silver particles is properly set in the present invention. For this purpose, it is required to leave the minimum amount of amine compound required to protect the silver particle surface and to remove the excessive amine compound to the outside of the system. Thus, washing of the silver particles precipitated is important in the present invention.

For the washing of these silver particles, an alcohol having a boiling point of 150° C. or lower, such as methanol, ethanol, or propanol is preferably applied as a solvent. As a detailed method of washing, preferably, a solvent is added to the solution after the silver particle synthesis, to stir the mixture until a suspension is obtained, and the supernatant solution is removed by decantation. The amount of the amine removed can be controlled by the volume of the solvent to be added and the number of washing. When a series of washing operations described above is adopted as one time of the number of washing, preferably, the silver particles are washed from one to five times by use of a solvent in a volume to be from $1/20$ to 3 times that of the solution after the silver particle synthesis.

The silver particles thus recovered may be formed into a metal paste by having them kneaded as a solid content together with an appropriate solvent. The solvent described above can be applied. Incidentally, a metal paste may be manufactured by kneading a solid content in which two or more kinds of silver particles manufactured by conducting the manufacture of the silver particles by the above steps in two or more systems are mixed with a solvent.

Advantageous Effects of the Invention

The metal paste containing silver particles having a particle size controlled according to the present invention can be sintered even in a low temperature region of 150° C. or lower, and has favorable printability. The sintered body produced from the metal paste of the present invention has a low resistance value equivalent to that of bulk silver. Thus, the metal paste can be applied as a conductive bonding material and is also useful as a bonding material of an electrical device such as a power device to deal with a high current.

DESCRIPTION OF EMBODIMENTS

Hereinafter, a preferred embodiment of the present invention will be described.

First Embodiment

Figure 1:
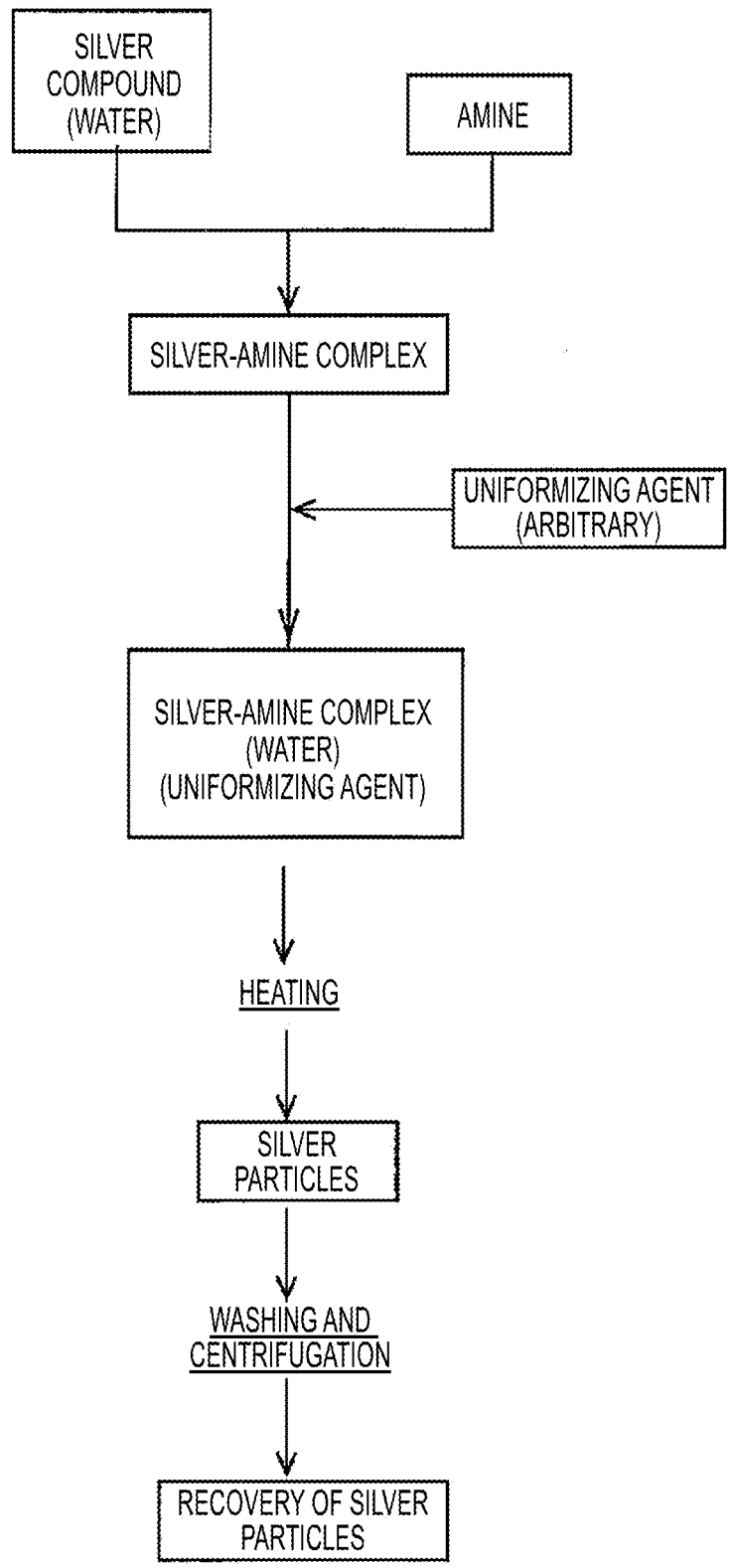
FIG. 1 is a diagram illustrating a process for manufacturing silver particles in a first embodiment.

A metal paste containing various kinds of additives such as an ethyl cellulose was manufactured, and properties of the metal paste were evaluated. Specifically, silver particles were manufactured, and the resulting silver particles were mixed with various kinds of additives, and then kneaded with a solvent to manufacture the metal paste. FIG. 1 shows an outline of a process for manufacturing silver particles.

Manufacture of Silver Particles

As a silver compound as a starting material, 102.2 g of silver carbonate was used so as to have a silver content of 80.0 g. As the silver compound, one brought into a wet state by adding 37.3 g (36.4 wt % based on 100 parts by mass of silver carbonate) was provided.

As an amine compound as a protective agent, 3-methoxypropylamine (in a molar ratio of 6 to the mass of silver in the silver compound) to the silver compound to manufacture a silver-amine complex. Mixing of the silver compound and the amine was performed at room temperature, and the non-complex area of the silver compound was properly reduced.

For the above silver-amine complex, water was also optionally added in consideration of the water content. Thereafter, the water content in the reaction system was checked before heating. The reaction system in which water content was confirmed was heated from room temperature to decompose the silver-amine complex, and silver particles were precipitated. The heating temperature at this time was set to 110 to 130° C. as the decomposition temperature of the complex, and this was adopted as the end-point temperature. Additionally, the heating rate was set to 10° C./min.

In the heating step, carbon dioxide was observed to have generated from nearby the decomposition temperature. Heating was continued until the generation of carbon dioxide stopped, and a liquid having therein silver particles suspended was obtained. After precipitation of the silver particles, methanol was added to the reaction mixture to wash the reaction mixture, and this was centrifuged. This washing and centrifugal separation were conducted twice.

Manufacture of Metal Paste

Texanol as a solvent was kneaded with the thus-obtained silver particles as a solid content, and an additive as shown in the table below was added and mixed to manufacture the metal paste. As the additive, polyvinyl butyral (PVB), polyvinyl pyrrolidone (PVP), STD100 (number average molecular weight: 63420) as an ethyl cellulose (ETHOCEL, registered trademark, manufactured by The Dow Chemical Company) having an ethoxy content of 48.0 to 49.6%, or STD7 (number average molecular weight: 17347) was provided. The content of silver particles was 70 wt % based on the total amount of the paste, and the content of the additive was 2.0 wt % based on the total amount of the paste. For the manufactured paste, the viscosity and the TI value ($\eta_{10}/\eta_{50}$) were measured. The results are shown in the table below.

Evaluation of Coating Performance

Each metal paste manufactured as described above was applied to a base material (PET or glass) from above a screen mask by screen printing. Thereafter, the metal paste was leveled for 10 minutes, and fired at 120° C. for 1 hour to obtain a sintered body. For the sintered body, the resistance value was measured using a four-probe method, the thickness was measured, and the volume resistance value was then calculated.

Evaluation of Adhesion

For the substrate to which the metal paste was transferred, adhesion to the base material (PET or glass) was evaluated. Adhesion to the PET base material was evaluated by a peel test. For the peel test, the sintered body was cut by 10×10 (100 matrix) with a cutter, and a pressure-sensitive adhesive tape was then pasted to the sintered body. Thereafter, the pressure-sensitive tape was peeled off from the sintered body at once, and the number of matrix remained on the sintered body was counted. In addition, adhesion to the glass base material was evaluated based on whether the sintered body was peeled off when an irregular surface, i.e. latex glove was rubbed with the sintered body. A sample in which the sintered body was not peeled off was rated "○", and a sample in which the sintered body was peeled off was rated "x".

Evaluation of Printability

In the SEM photographs (FIG. 2), the substrate to which the metal paste was transferred as described above was observed and evaluated was performed based on the following criteria. A sample in which a line portion was consistent with a transfer shape designed with a screen mask, and the boundary line of the line portion was clear was rated "⊙", a sample in which deformations such as irregularities, defects or the like occurred to some degree in a line portion, but the boundary line of the line portion was clear was rated "○", a sample in which deformations, defects or the like occurred in a line portion, but there was no problem in practical use was rated "Δ", and a sample in which large deformations or defects occurred in a line portion, and the boundary line of the line portion was unclear was rated "x".

TABLE 2

| Experiment No. | 1-a | 1-b | 1-c | 1-d |
|---|---|---|---|---|
| Additive | PVB | PVP | STD100 | STD7 |
| Addition amount [wt %] | 2.0 | 2.0 | 2.0 | 2.0 |
| Viscosity at rotation number of 10 [Pa · s] | 116.2 | 61.0 | 129.0 | 83 |
| Viscosity at rotation number of 50 [Pa · s] | 16.3 | 10.2 | 23.5 | 19.6 |
| TI value [$\eta_{10}/\eta_{50}$] | 3.6 | 3.0 | 2.7 | 2.1 |
| Resistance [mΩ/□/10 μm] | 10.2 | 35.9 | 6.4 | 47.6 |
| Thickness [μm] | 5.8 | 5.3 | 6.2 | 9.3 |
| Volume resistance [μΩ · cm] | 5.90 | 19.03 | 3.96 | 44.3 |
| Adhesion (PET) | 0 | 0 | 100 | 100 |
| Adhesion (glass) | X | X | ○ | ○ |
| Printability (PET) | ○ | X | ○ | ⊙ |

Figure 2:
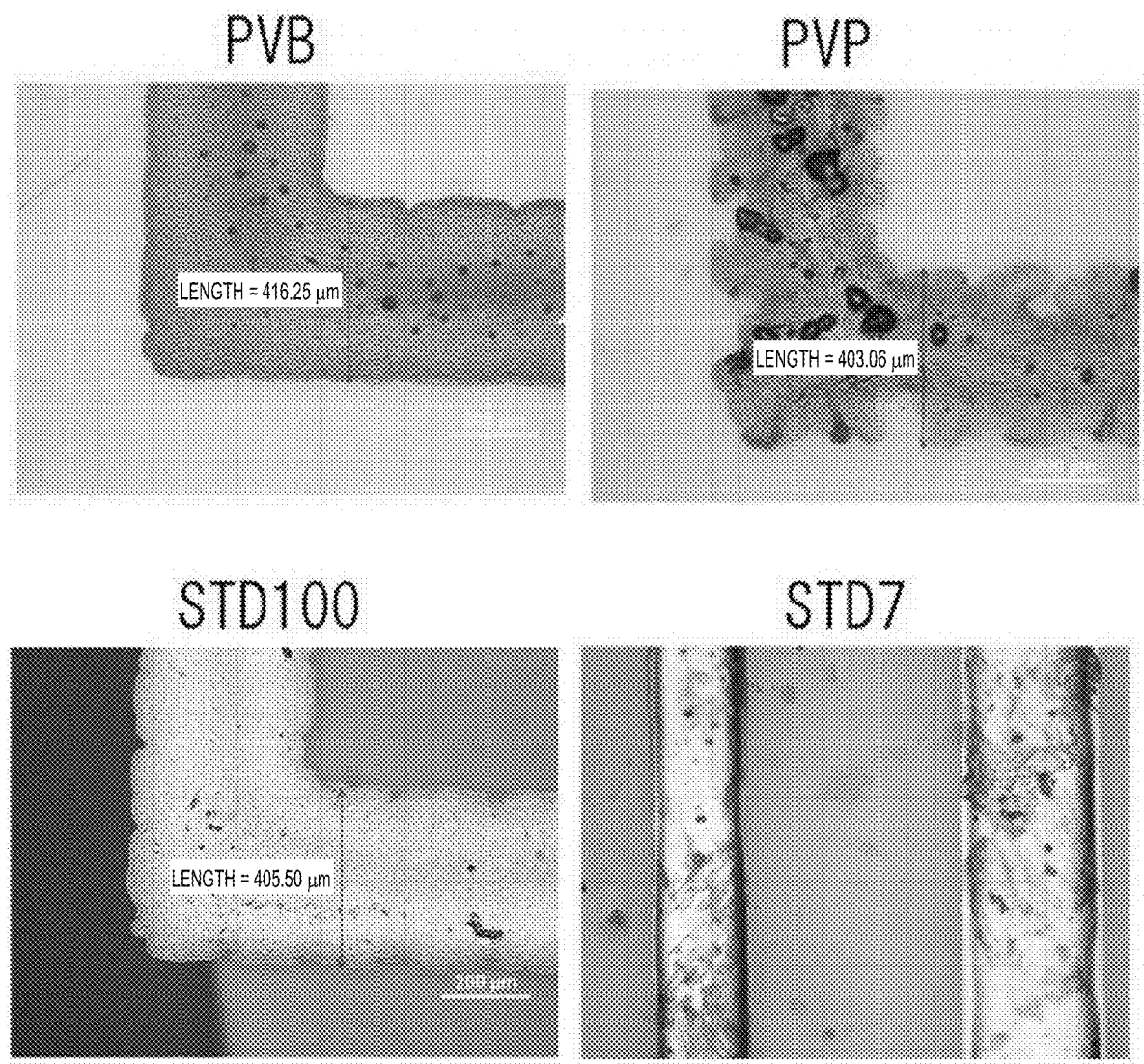
FIG. 2 shows SEM photographs of a metal paste after transfer of the metal paste to a substrate in the first embodiment.

The above table and FIG. 2 show that when PVB, STD100 or STD7 was used as an additive, favorable printability was obtained, and in particular, when STD7 was used, very favorable printability was obtained. Next, the results for adhesion showed that when STD100 or STD7 was used, favorable adhesion was obtained in application of the metal paste onto any of the base materials of PET and glass. The sintered body had a low and favorable resistance value when PVB or STD100 was used. Thus, it was found that in a metal paste using STD 100 as a high-molecular-weight ethyl cellulose as an additive, printability, adhesion with a substrate and the resistance value of the sintered body were well-balanced and favorable.

Figure 3:
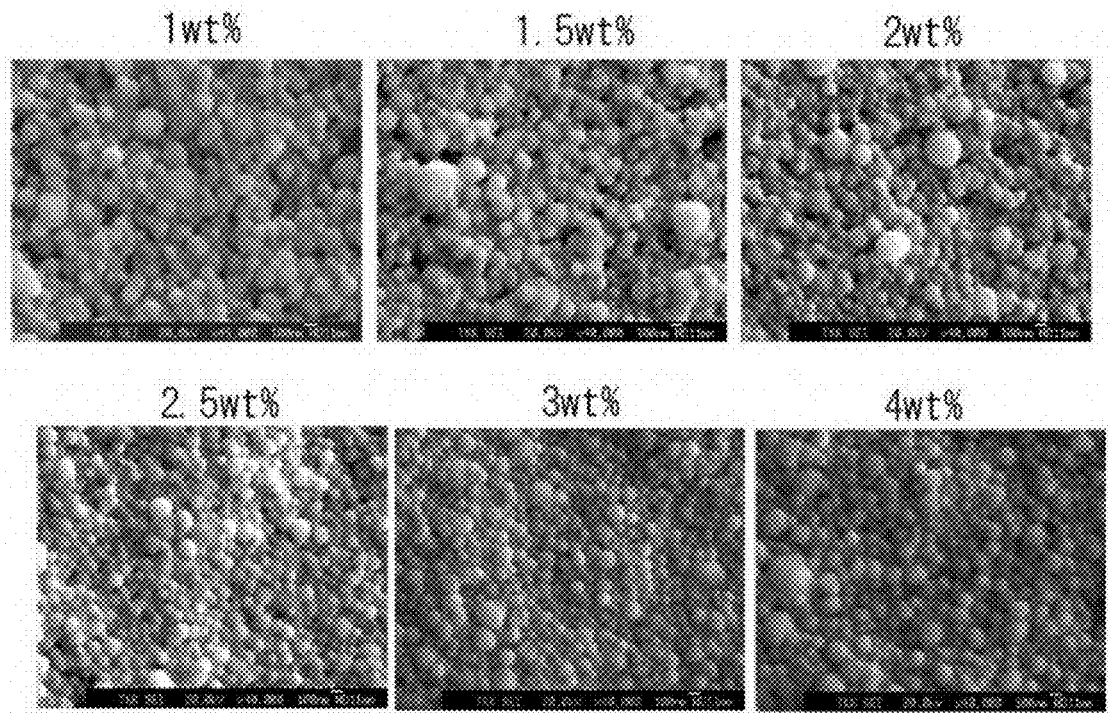
FIG. 3 shows SEM photographs of the metal paste in the first embodiment.
Figure 4:
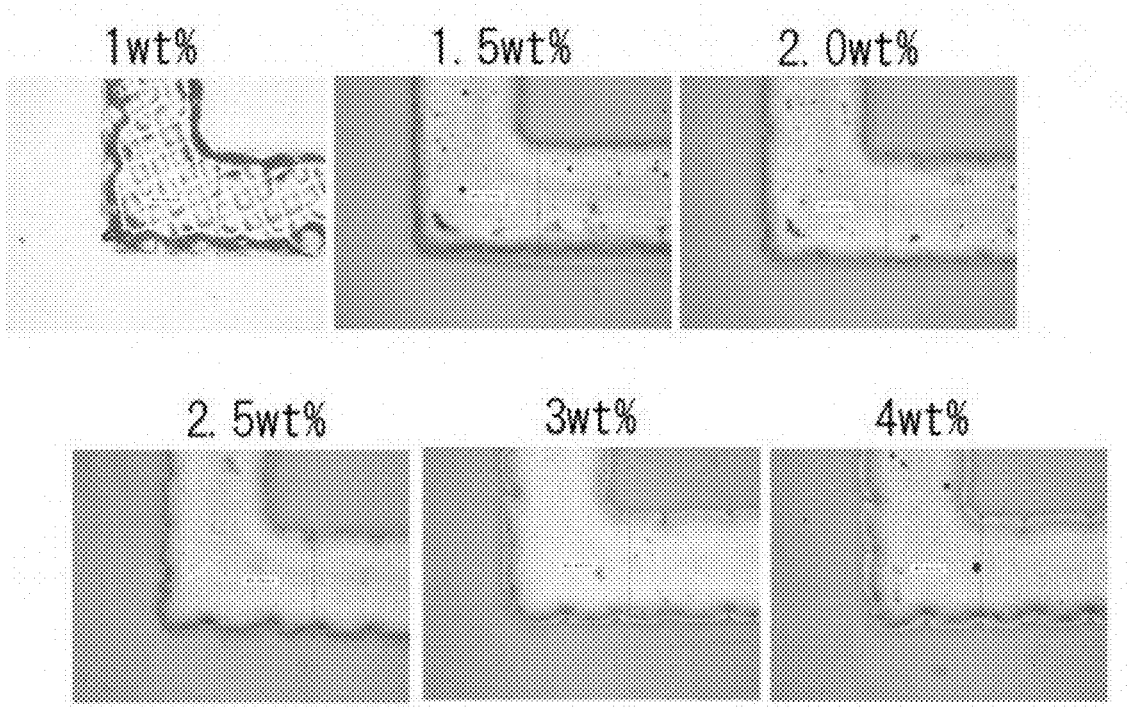
FIG. 4 shows SEM photographs of the metal paste after transfer of the metal paste to a substrate in the first embodiment.

Next, a metal paste with the additive content changed as in the table below on the basis of the metal paste No. 1-c using STD100 as an additive, and various kinds of properties of the metal paste were evaluated. PET was used as a base material, and other operation conditions were the same as described above. The results are shown in the table below. FIG. 3 shows SEM photographs of the metal paste, and FIG. 4 shows results of printing.

TABLE 3

| Experiment No. | 1-e | 1-f | 1-g | 1-c | 1-h | 1-i | 1-j |
|---|---|---|---|---|---|---|---|
| Addition amount [wt %] | 0 | 1.0 | 1.5 | 2.0 | 2.5 | 3.0 | 4.0 |
| Viscosity at rotation number of 10 [Pa · s] | 23.5 | 252.0 | 73.0 | 129.0 | 191.0 | 357.0 | 294.0 |
| Viscosity at rotation number of 50 [Pa · s] | — | 41.2 | 14.7 | 23.5 | 39.4 | 65.7 | 56.0 |
| TI value [$\eta_{10}/\eta_{50}$] | — | 3.1 | 2.5 | 2.7 | 2.4 | 2.7 | 2.6 |
| Resistance value [mΩ/□/10 μm] | N.D. | 6.3 | 6.5 | 6.4 | 7.4 | 10.8 | 10.1 |
| Thickness [μm] | N.D. | 10.0 | 6.3 | 6.2 | 6.5 | 7.0 | 6.3 |
| Volume resistance [μΩ · cm] | N.D. | 6.26 | 4.05 | 3.96 | 4.83 | 7.54 | 6.38 |
| Adhesion | N.D. | 100 | 100 | 100 | 100 | 100 | 100 |
| Printability | N.D. | Δ | ○ | ○ | ○ | ○ | Δ |

FIG. 3 shows that a portion with silver particles forming a network was observed at an additive content of 3.0 wt % or less. In addition, FIG. 4 shows that favorable printability was obtained at an additive content of 1.5 to 3.0 wt %. Further, the above table shows that the resistance value was low at an additive content of 1.5 to 2.5 wt %.

Second Embodiment

A metal paste containing two types of ethyl celluloses as an additive was manufactured, and various kinds of properties of the metal paste were evaluated. The metal paste was manufactured with ethyl celluloses (STD100 and STD7) added in such a manner that the content of the ethyl celluloses based on the total amount of the paste was as described below, and properties of the metal paste were evaluated. PET was used as a base material, and other manufacturing conditions were the same as in the first embodiment. The results are shown in the table below and FIG. 5.

TABLE 4

| Experiment No. | 2-k | 2-l | 2-m | 2-n |
|---|---|---|---|---|
| STD100 content $C_{HIGH}$ [wt %] | 1.7 | 1.7 | 1.7 | 1.7 |
| STD7 content $C_{LOW}$ [wt %] | 0 | 0.25 | 0.75 | 1.5 |
| Additive mixing ratio $C_{LOW}/C_{HIGH}$ | — | 0.14 | 0.44 | 0.88 |
| Viscosity at rotation number of 10 [Pa · s] | 98.0 | 103.0 | 136.0 | 180.0 |
| Viscosity at rotation number of 50 [Pa · s] | 19.1 | 21.0 | 25.9 | 35.1 |
| TI value [$\eta_{10}/\eta_{50}$] | 2.6 | 2.5 | 2.6 | 2.6 |
| Resistance value [mΩ/□/10 μm] | 6.6 | 6.7 | 7.7 | 11.2 |
| Thickness [μm] | 5.8 | 5.8 | 5.7 | 6.0 |
| Volume resistance [μΩ · cm] | 3.8 | 3.9 | 4.4 | 6.7 |
| Adhesion | 100 | 100 | 100 | 100 |
| Printability | ○ | ◉ | ○ | ○ |

Figure 5:
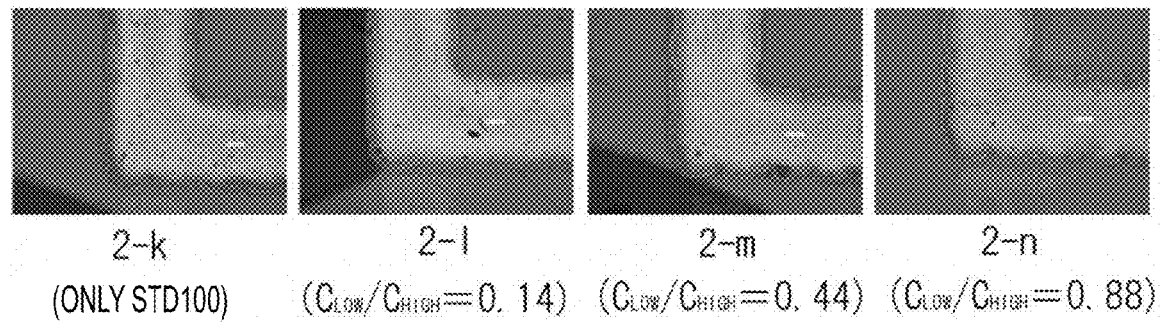
FIG. 5 shows SEM photographs of a metal paste after transfer of the metal paste to a substrate in a second embodiment.

Table 4 and FIG. 5 show favorable printability was obtained when a metal paste containing two types of ethyl celluloses (STD7 and STD100) was used. In addition, printability tended to be further improved when the mixing ratio $C_{LOW}/C_{HIGH}$ was 0.2 or less.

Third Embodiment

In this embodiment, as with the second embodiment, a metal paste containing two types of ethyl celluloses as an additive was manufactured, and various kinds of properties of the metal paste were evaluated. The added ethyl celluloses are as follows. STD45 (number average molecular weight: 56489) as an ethyl cellulose (ETHOCEL (registered trademark) manufactured by The Dow Chemical Company) having an ethoxy content of 48.0 to 49.6%, or STD200 (number average molecular weight: 80733) was used as the high-molecular-weight ethyl cellulose. As the low-molecular-weight ethyl cellulose, STD7 was added. Two types of ethyl celluloses were added to manufacture the metal paste, and properties of the metal paste were evaluated. PET was used as a base material, and other manufacturing conditions were the same as in the first embodiment. The results are shown in Table 5 below. The results for the metal paste containing STD100 and STD7 in the second embodiment (2-I) are also shown in Table 5.

TABLE 5

| Experiment No. | 2-o | 2-l | 2-p |
|---|---|---|---|
| High-molecular-weight ethyl cellulose | STD45 | STD100 | STD200 |
| Addition amount $C_{HIGH}$ [wt %] | 1.7 | 1.7 | 1.7 |
| Low-molecular-weight ethyl cellulose | | STD7 | |
| Addition amount $C_{LOW}$ [wt %] | | 0.25 | |
| Additive mixing ratio $C_{LOW}/C_{HIGH}$ | 0.14 | 0.14 | 0.14 |
| Viscosity at rotation number of 10 [wt %] | 98 | 103 | 239 |
| Viscosity at rotation number of 50 [wt %] | 40 | 21 | 80 |
| TI value [$\eta_{10}/\eta_{50}$] | 1.23 | 2.45 | 1.49 |
| Resistance value [mΩ/□/10 μm] | 5 | 6.7 | 3.4 |
| Thickness [μm] | 4 | 5.8 | 5.2 |
| Volume resistance [μΩ · cm] | 5 | 3.9 | 4.4 |
| Adhesion | 100 | 100 | 100 |
| Printability | ◉ | ◉ | ◉ |

In this embodiment, the number average molecular weight of the high-molecular ethyl cellulose to be mixed is changed, and the resulting metal pastes are examined. As is apparent from Table 5, it was confirmed that these metal pastes had favorable printability.

Fourth Embodiment

In this embodiment, as with the second embodiment, a metal paste containing two types of ethyl celluloses as an additive was manufactured, and various kinds of properties of the metal paste were evaluated. The added ethyl celluloses are as follows. STD100 was added as a high-molecular-weight ethyl cellulose. As a low-molecular-weight ethyl cellulose, STD4 (number average molecular weight: 13742) as an ethyl cellulose (ETHOCEL (registered trademark) manufactured by The Dow Chemical Company) having an ethoxy content of 48.0 to 49.6%, or STD10 (number average molecular weight: 22760) was used. Two types of ethyl celluloses were added to manufacture the metal paste, and properties of the metal paste were evaluated. PET was used as a base material, and other manufacturing conditions were the same as in the first embodiment. The results are shown in Table 6 below. The results for the metal paste containing STD100 and STD7 in the second embodiment (2-l) are also shown in Table 6.

TABLE 6

| Experiment No. | 2-q | 2-l | 2-r |
|---|---|---|---|
| High-molecular-weight ethyl cellulose | | STD100 | |
| Addition amount $C_{HIGH}$ [wt %] | | 1.7 | |
| Low-molecular-weight ethyl cellulose | STD4 | STD7 | STD10 |
| Addition amount $C_{LOW}$ [wt %] | 0.25 | 0.25 | 0.25 |
| Additive mixing ratio $C_{LOW}/C_{HIGH}$ | 0.14 | 0.14 | 0.14 |
| Viscosity at rotation number of 10 [wt %] | 85 | 103 | 90 |
| Viscosity at rotation number of 50 [wt %] | 38 | 21 | 41 |
| TI value [$\eta_{10}/\eta_{50}$] | 1.12 | 2.45 | 1.10 |
| Resistance value [mΩ/□/10 μm] | 4 | 6.7 | 2.8 |
| Thickness [μm] | 4.2 | 5.8 | 4.2 |
| Volume resistance [μΩ · cm] | 4.3 | 3.9 | 3 |
| Adhesion | 100 | 100 | 100 |
| Printability | ◉ | ◉ | ◉ |

In this embodiment, the number average molecular weight of the low-molecular ethyl cellulose to be mixed is changed, and the resulting metal pastes are examined. As is apparent from Table 6, it was confirmed that these metal pastes had favorable printability.

Fifth Embodiment

In this embodiment, for confirming preferred conditions for a silver compound and an amine compound in a metal paste, thermal analysis, sintering property and resistance of a sintered body were evaluated for silver particles manufactured under various kinds of conditions.

Manufacture of Silver Particles

As the silver compound to be the starting material, 1.41 g of silver oxalate or 1.28 g of silver carbonate was used so as to be 1 g as the silver content. Regarding these silver compounds, a dry product was used as it is and those in a wet state were prepared by adding 0.3 g of water to these silver compounds (21 parts by mass based on 100 parts by mass of silver oxalate, and 23 parts by mass based on 100 parts by mass of silver carbonate).

A silver-amine complex was manufactured by adding various kinds of amine compounds as a protective agent to the silver compound. Mixing of the silver compound and the amine was conducted at room temperature, and the mixture was kneaded until it becomes creamy. A urea solution and DMF as the uniformizing agent were optionally added to the silver-amine complex thus manufactured in combination. Additionally, water was also optionally added in consideration of the water content. Thereafter, the water content in the reaction system was checked before heating. Incidentally, as another example of non-amine-containing protective agent, one to which oleic acid was applied was prepared.

The reaction system in which water content was confirmed was heated from room temperature to decompose the silver-amine complex, and silver particles were precipitated. The heating temperature at this time was set to 110 to 130° C. as the decomposition temperature of the complex, and this was adopted as the end-point temperature. Additionally, the heating rate was set to 10° C./min.

Figure 6:
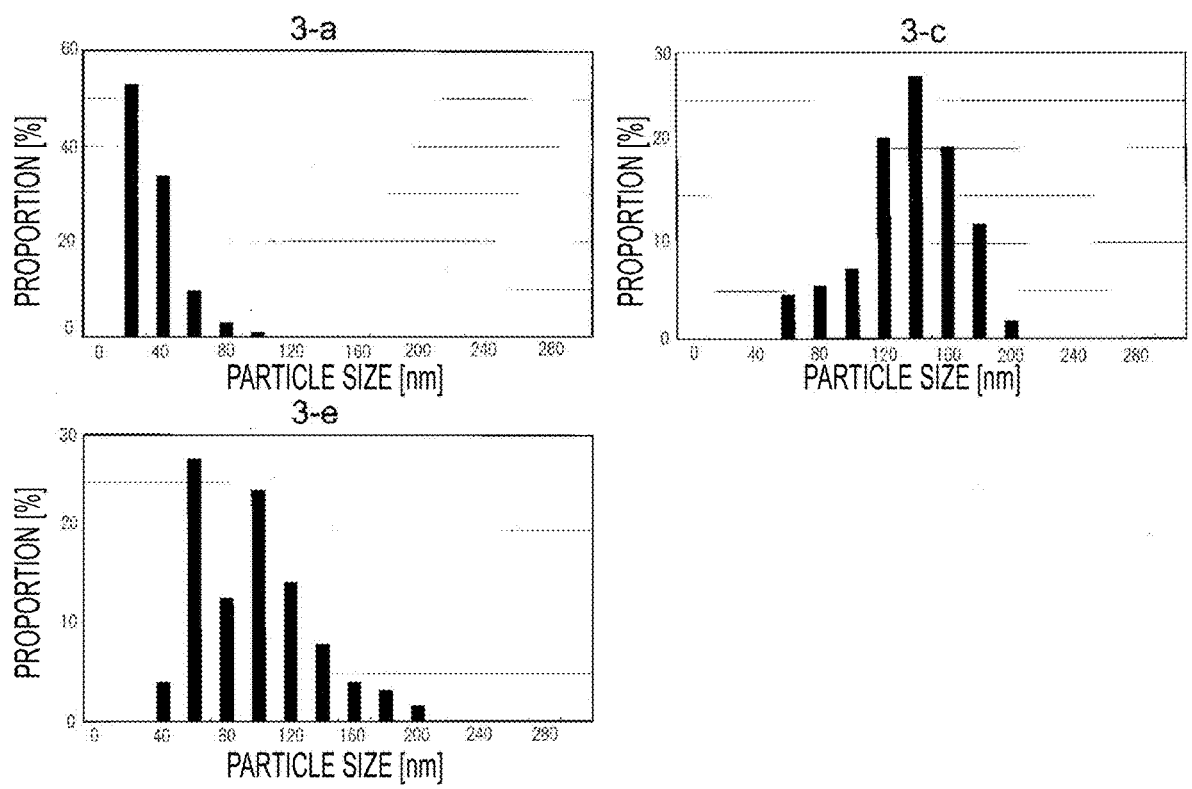
FIG. 6 shows graphs illustrating a particle size distribution of a metal paste manufactured in a third embodiment.

In the heating step, the generation of carbon dioxide was observed from nearby the decomposition temperature. Heating was continued until the generation of carbon dioxide stopped, and a liquid in which silver particles are suspended was obtained. After precipitation of the silver particles, methanol was added to the reaction mixture to wash the reaction mixture, and this was centrifuged. This washing and centrifugal separation were conducted twice. The following silver particles were manufactured through the above process and the substrate coated with the metal paste was held for 2 hours in the stage in which the temperature reached 150° C. to sinter the metal paste. For the sintered body, the presence or absence of sintered body formation was evaluated through SEM observation, and the volume resistivity was then measured. In addition, adhesion was evaluated by a peel test in the same manner as in the first embodiment. The analytical results and the results for the low temperature sintering test of the metal pastes manufactured in Embodiment are shown in Table 6. Additionally, the results for pastes 3-a, 3-c and 3-e are shown in FIG. 6 as an example of the measurement results of the particle size distribution.

TABLE 8

| | | | Proportion | Results of sintering test | |
| | N/Ag | Average particle size*1 | of particles of 100 to 200 nm*2 | Sintered or not | Volume resistance [μΩ · cm] | Adhesion |
| --- | --- | --- | --- | --- | --- | --- |
| 3-a | 0.0045 | 30 nm | 1% | ○*3 | 32.8 | 0 |
| 3-b | 0.0029 | 80 nm | 33% | ○ | 4.6 | 100 |
| 3-c | 0.0018 | 125 nm | 89% | ○ | 4.1 | 100 |
| 3-d | 0.0003 | 400 nm | 34% | ○ | 4.7 | 100 |
| 3-e | — | 80 nm | 56% | X | 290 | 0 |
| 3-f | 0.0001 | 990 nm | 8% | X | 174 | 0 |

*1 Average particle size of silver particles as a whole
*2 Based on number of particles
*3 Sintered, but cracks generated

TABLE 7

| | Protective agent | | | Additive | | Produced particles | |
| Silver compound | Type | Addition amount*1 | Water content*2 | Type | Addition amount | Average particle size | Proportion of particles of 100 to 200 nm*3 |
| --- | --- | --- | --- | --- | --- | --- | --- |
| 3-a Silver oxalate | Hexylamine | 3 | 0 | — | — | 30 nm | 1% |
| 3-b Silver carbonate | N,N-diethyl-1,3-diaminopropane | 4 | 23 | — | — | 80 nm | 33% |
| 3-c Silver oxalate | Hexylamine | 3 | 21 | DMF + urea | 1.4 g | 125 nm | 89% |
| 3-d Silver carbonate | N,N-dimethyl-1,3-diaminopropane | 3 | 23 | — | — | 400 nm | 34% |
| 3-e Silver oxalate | Oleic acid | 2 | 21 | — | — | 80 nm | 56% |
| 3-f Silver carbonate | Propylamine | 3 | 23 | — | — | 990 nm | 8% |

*1 Mass ratio of protective agent to mass of silver in silver compound
*2 Parts by weight based on 100 parts by weight of silver compound
*3 Based on number of particles

Manufacture of Metal Paste

Texanol as a solvent was kneaded with the silver particles as a solid content to manufacture a metal paste. The proportion of solid content at this time was 80 to 95 mass %. The metal pastes thus manufactured were appropriately sampled and observed by a SEM to measure the particle size distribution. Additionally, the N content was measured by the CHN elemental analysis (JM10 manufactured by J-SCIENCE LAB CO., Ltd.), and the ratio (N mass %/Ag mass %) of the N content to the silver content was calculated.

Low Temperature Sintering Test

The metal pastes manufactured above were sintered at low temperature, and the presence or absence of sintering and the electrical resistance and the adhesive property, i.e. binding force of the sintered body were evaluated. For this low temperature sintering test, each of the metal pastes was coated (intended to have a thickness of 50 μm) on a Si substrate (with gold plating) by 50 mg, the temperature was raised to 150° C. at a temperature rising rate of 2° C./min, Table 6 shows that for low-temperature sinterability at 150° C., the paste 3-a which tends to have a small proportion of silver particles having a particle size of 100 to 200 nm and a small average particle size is easily sintered, but forms a sintered body having a high resistance value, and has poor adhesion. On the other hand, the paste 3-f which tends to have a large average particle size etc. is hardly sintered.

In contrast to the above results, the metal pastes (3-b, 3-c and 3-d) which properly contain silver particles having a suitable particle size (100 to 200 nm) and suitably contain a protective agent exhibit favorable low-temperature sinterability, and cracks were also not generated. Additionally, the resistance value is also a value close to that of silver of a bulk body, and the adhesive property is also favorable. Consequently, it can be said that these metal pastes are rapidly sintered even in a low temperatures region of 150° C. The metal paste 3-e to which not an amine compound but oleic acid is applied as a protective agent is not sintered at low temperature although the proportion of silver particles having a particle size of 100 to 200 nm is suitable.

Analysis on Thermal Behavior

Next, the TG-DTA analysis (differential thermal analysis) to heat the metal paste at a certain temperature-rising rate was conducted to confirm the number of exothermic peaks due to sintering of the silver particles and the generation temperature. This test may be more suitable for analysis of the thermal behavior than the thermal history analyzed in the low-temperature sintering test (holding at 150° C. for 2 hours) in which the heating temperature is not changed. In this test, the temperature rising rate is preferably 5° C./min to 20° C./min. In addition, the measurement was conducted in temperature range of room temperature to 500° C. and at a temperature rising rate of 10° C./min.

Figure 7:
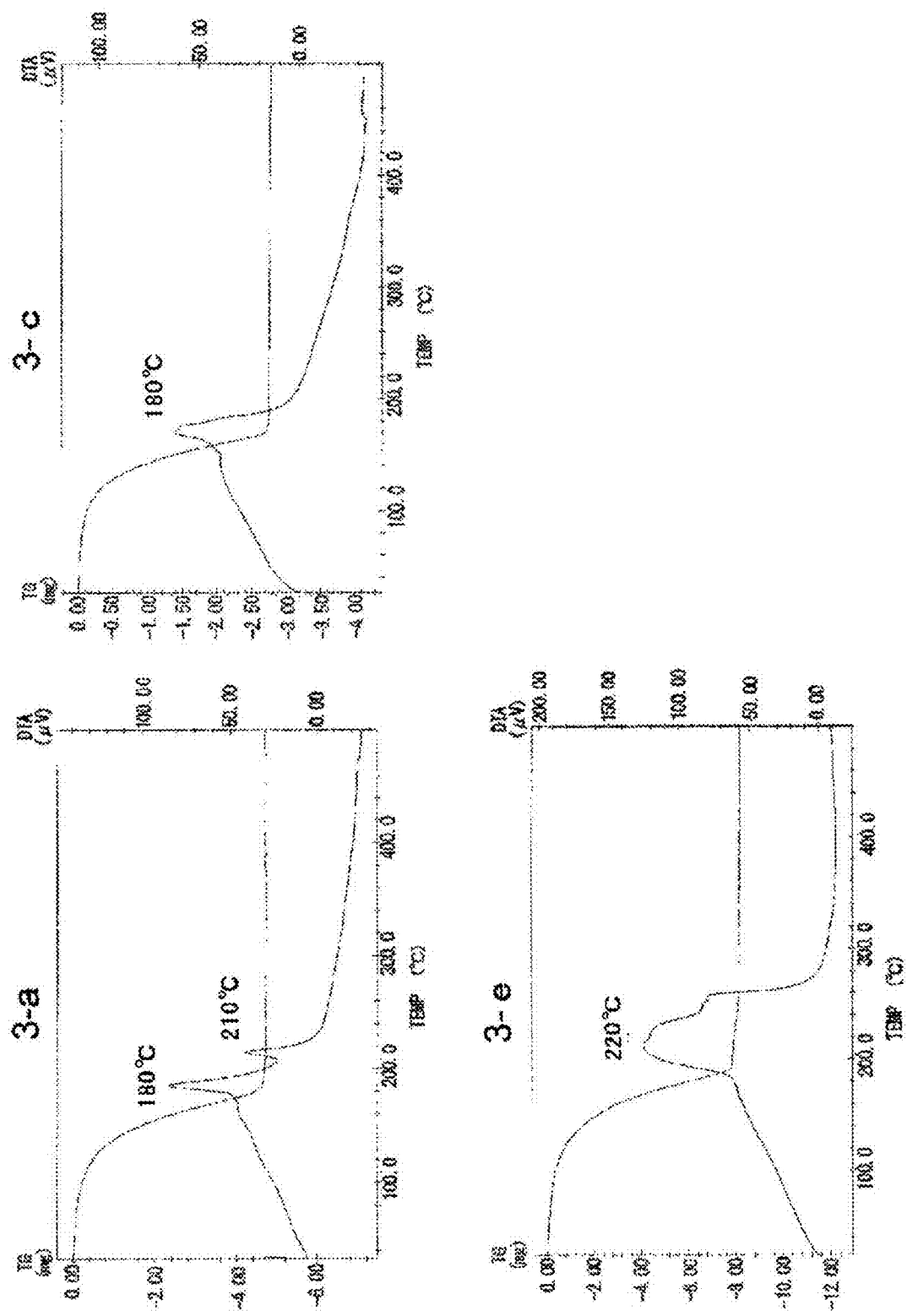
FIG. 7 shows graphs illustrating results of DTA analysis of the metal paste manufactured in the third embodiment.

As a result of the TG-DTA analysis, it was found that the metal pastes can be grouped in accordance with whether the number of exothermic peaks is 1 or 2 and whether the generation temperature is higher than 200° C. or not in sintering of the silver particles of the metal pastes. FIG. 7 shows DTA curves of the pastes 3-a, 3-c and 3-e. The measurement results of the number of exothermic peaks resulting from sintering of silver particles and the generation temperature are shown in Table 9.

TABLE 9

|  | N/Ag | Average particle size*[1] | Proportion of particles of 100 to 200 nm*[2] | DTA analysis | |
| --- | --- | --- | --- | --- | --- |
|  |  |  |  | Number of peaks | Peak position |
| 3-a | 0.0045 | 30 nm | 1% | 2 | 180° C., 210° C. |
| 3-b | 0.0029 | 80 nm | 33% | 1 | 190° C. |
| 3-c | 0.0018 | 125 nm | 89% | 1 | 180° C. |
| 3-d | 0.0003 | 400 nm | 34% | 1 | 180° C. |
| 3-e | — | 80 nm | 56% | 1 | 220° C. |
| 3-f | 0.0001 | 990 nm | 8% | 1 | 250° C. |

*[1]Average particle size of silver particles as a whole
*[2]Based on number of particles According to the DTA analysis, the metal paste (3-a) mainly containing fine silver particles having a particle size of 20 to 30 nm has an exothermic peak even at 200° C. or higher (210° C. and 230° C.) in addition to an exothermic peak at lower than 200° C. (180° C. and 190° C.). A plurality of exothermic peaks appear in this manner, and it is considered that this is because the sintering behavior of the fine silver particles progresses in multiple stages.

In comparison with this, the metal pastes (3-b, 3-c and 3-d) mainly composed of particles having a particle size of 100 to 200 nm show characteristic behaviors, and each have only one exothermic peak in a temperature range below 200° C. (180° C. and 190° C.). The fact that only one exothermic peak is generated indicates that sintering of the silver particles is fully completed in one stage. The phenomenon in which an exothermic peak appears singly in a low temperature range in this manner is specific.

From the results of DTA analysis in addition to the thermal behavior of the fine silver particles described above, it has been reconfirmed that selection of an appropriate amine as a protective agent for the silver particles is necessary. When not an amine compound but oleic acid is applied as the protective agent, the exothermic peak due to sintering is one, but the temperature is high of 200° C. or higher (3-e).

Sixth Embodiment

In this embodiment, a metal paste was manufactured with a polyester resin added as a binder, and properties of the metal paste were evaluated. A metal paste containing 0.5 to 2.0% by mass of a polyester resin having a molecular weight of 16000 on the basis of the metal paste (2-i) containing STD100 and STD7 in the second embodiment was manufactured. In this embodiment, a liquid crystal polymer was used as a base material. The manufactured metal paste was applied to a base material from above a screen mask by screen printing. Thereafter, the metal paste was leveled for 10 minutes, and fired at 200° C. for 1 hour to obtain a sintered body. For the sintered body, the resistance value was measured using a four-probe method, the thickness was measured, and the volume resistance value was then calculated. Further, adhesion and printability were evaluated in the same manner as in the first embodiment. The results are shown in Table 10.

TABLE 10

| Experiment No. | 2-1 | 4-a | 4-b | 4-c | 4-d |
| --- | --- | --- | --- | --- | --- |
| High-molecular-weight ethyl cellulose | STD100 | | | | |
| Addition amount $C_{HIGH}$ [wt %] | 1.7 | | | | |
| Low-molecular-weight ethyl cellulose | STD7 | | | | |
| Addition amount $C_{LOW}$ [wt %] | 0.25 | | | | |
| Additive mixing ratio $C_{LOW}/C_{HIGH}$ | 0.14 | | | | |
| Binder | Polyester resin | | | | |
| Binder content | 0 | 0.5 | 1 | 1.5 | 2 |
| Viscosity at rotation number of 10 [wt %] | 103 | 128 | 142 | 154 | 179 |
| Viscosity at rotation number of 50 [wt %] | 21 | 42.4 | 53.8 | 54.4 | 51.8 |
| Volume resistance [wt %] | 3.9 | 5 | 5 | 36.2 | 151.3 |
| Adhesion [μΩ · cm] | 0 | 0 | 100 | 100 | 100 |
| Printability | ⊙ | ⊙ | ⊙ | ⊙ | ⊙ |

Thus, it is apparent that the metal paste according to the present invention may contain additives other than (high-molecular-weight and low molecular weight) ethyl celluloses. It is apparent that a metal paste containing an appropriate amount of a polyester resin as a binder exhibits favorable adhesion to a liquid crystal polymer base material. Favorable printability was exhibited regardless of presence/absence of a polyester resin.

INDUSTRIAL APPLICABILITY

As described above, the silver paste according to the present invention contains an ethyl cellulose, and is thus capable of forming a favorable pattern in printing of the silver paste to a substrate or the like, and a silver sintered body formed from the silver paste has low resistance. Thus, the silver paste can be widely used as a wiring material, a bonding material, or a thermally conductive material which require a sintering treatment at low temperature.

The invention claimed is:
1. A metal paste comprising:
   a solid content including silver particles wherein 30% or more of the total number of silver particles in the metal paste have a particle size of 100 to 200 nm, the silver particles have an average particle size of 60 to 800 nm as a whole, and the silver particles constituting the solid content are bound with an amine compound having 4 to 8 carbon atoms in total as a protective agent,
   a solvent, and
   a first additive that is a high-molecular-weight ethyl cellulose having a number average molecular weight of 40000 to 90000.

2. The metal paste according to claim 1, further comprising a second additive that is a low-molecular-weight ethyl cellulose having a number average molecular weight of 5000 to 30000.

3. The metal paste according to claim 2, wherein the ratio ($C_{LOW}/C_{HIGH}$) of the content ($C_{LOW}$) of the low-molecular-weight ethyl cellulose to the content ($C_{HIGH}$) of the high-molecular-weight ethyl cellulose is 0.05 to 1.0.

4. The metal paste according to claim 3, wherein the amine compound as a protective agent is butylamine, 1,4-diaminobutane, 3-methoxypropylamine, pentylamine, 2,2-dimethylpropylamine, 3-ethoxypropylamine, N,N-dimethyl-1,3-diaminopropane, 3-ethoxypropylamine, hexylamine, heptylamine, N,N-diethyl-1,3-diaminopropane, or benzyl amine.

5. The metal paste according to claim 3, wherein the solvent is an organic solvent having 8 to 16 carbon atoms, an OH group in the structure, and a boiling point of 280° C. or lower.

6. The metal paste according to claim 3, further comprising a third additive that is a binder resin present in an amount such that the metal paste is 0.8 to 2.5% by mass of binder resin.

7. The metal paste according to claim 2, wherein the amine compound as a protective agent is butylamine, 1,4-diaminobutane, 3-methoxypropylamine, pentylamine, 2,2-dimethylpropylamine, 3-ethoxypropylamine, N,N-dimethyl-1,3-diaminopropane, 3-ethoxypropylamine, hexylamine, heptylamine, N,N-diethyl-1,3-diaminopropane, or benzyl amine.

8. The metal paste according to claim 2, wherein the solvent is an organic solvent having 8 to 16 carbon atoms, an OH group in the structure, and a boiling point of 280° C. or lower.

9. The metal paste according to claim 2, further comprising a third additive that is a binder resin present in an amount such that the metal paste is 0.8 to 2.5% by mass of binder resin.

10. The metal paste according to claim 1, wherein the amine compound as a protective agent is butylamine, 1,4-diaminobutane, 3-methoxypropylamine, pentylamine, 2,2-dimethylpropylamine, 3-ethoxypropylamine, N,N-dimethyl-1,3-diaminopropane, 3-ethoxypropylamine, hexylamine, heptylamine, N,N-diethyl-1,3-diaminopropane, or benzyl amine.

11. The metal paste according to claim 10, wherein the solvent is an organic solvent having 8 to 16 carbon atoms, an OH group in the structure, and a boiling point of 280° C. or lower.

12. The metal paste according to claim 1, wherein the solvent is an organic solvent having 8 to 16 carbon atoms, an OH group in the structure, and a boiling point of 280° C. or lower.

13. The metal paste according to claim 1, further comprising a third additive that is a binder resin present in an amount such that the metal paste is 0.8 to 2.5% by mass of binder resin.

* * * * *